United States Patent
Sato

(10) Patent No.: US 8,432,151 B2
(45) Date of Patent: Apr. 30, 2013

(54) FILM-THICKNESS MEASURING DEVICE USING PLL CIRCUIT

(75) Inventor: Hiroaki Sato, Yonezawa (JP)

(73) Assignees: Pioneer Corporation, Kawasaki-shi, Kanagawa (JP); Tohoku Pioneer Corporation, Tendo-shi, Yamagata (JP)

( * ) Notice: Subject to any disclaimer, the term of this patent is extended or adjusted under 35 U.S.C. 154(b) by 308 days.

(21) Appl. No.: 13/002,865

(22) PCT Filed: Sep. 22, 2008

(86) PCT No.: PCT/JP2008/067096
§ 371 (c)(1),
(2), (4) Date: Jan. 6, 2011

(87) PCT Pub. No.: WO2010/032328
PCT Pub. Date: Mar. 25, 2010

(65) Prior Publication Data
US 2011/0115467 A1    May 19, 2011

(51) Int. Cl.
*G01R 23/00*    (2006.01)
(52) U.S. Cl.
USPC ............... 324/76.49; 324/76.52; 324/76.53; 324/76.55
(58) Field of Classification Search ............... 234/76.49
See application file for complete search history.

(56) References Cited

U.S. PATENT DOCUMENTS 7,310,874 B2 * 12/2007 Higuchi et al. ............... 29/842
2005/0081635 A1    4/2005 Kobayashi

FOREIGN PATENT DOCUMENTS

| JP | 6-077823 A | 3/1994 |
| JP | 8-340254 A | 12/1996 |
| JP | 11-160057 A | 6/1999 |
| JP | 2001-044757 A | 2/2001 |
| JP | 2004-279167 A | 10/2004 |

OTHER PUBLICATIONS

Oki Electric, JP6-77823, JPO machine translation, p. 1-13.*
Atsushi, JP11-160057, JPO machine translation, p. 1-7.*
International Search Report of PCT/JP2008/067096, mailing date Dec. 9, 2008.

* cited by examiner

*Primary Examiner* — Thomas Valone
(74) *Attorney, Agent, or Firm* — Westerman, Hattori, Daniels & Adrian, LLP

(57) ABSTRACT

A phase comparator (4) for detecting a phase difference between a first signal and a second signal, a first oscillating circuit (1) for supplying the phase comparator with a reference signal as the first signal, and a DDS (8) as a second oscillating circuit for outputting a signal according to an output of the above-mentioned phase comparator are provided.

As for a filter-thickness measuring device using the PLL circuit as a frequency measurement circuit, a crystal oscillator (11) which is made of quartz etc. and connected to the first oscillating circuit is accommodated in a vacuum chamber (C). It is arranged that the frequency measurement circuit which constitutes the PLL circuit measures a film thickness of the film forming material based on a change of a natural frequency of a piezoelectric crystal, the change being caused by the film forming material deposited on the piezoelectric element in the vacuum chamber.

3 Claims, 11 Drawing Sheets

[A] [B]

FILM-THICKNESS MEASURING DEVICE USING PLL CIRCUIT

TECHNICAL FIELD

The present invention relates to a film-thickness measuring device that can measure a film thickness and a film forming speed (or deposition rate) correctly by using a PLL circuit, in which noises and jitter in an output signal are reduced, for an oscillating circuit for a QCM-type film-thickness meter.

BACKGROUND ART

Conventionally, a PLL (Phase-locked loop) circuit is widely used for electric devices including a communication device etc. and it is arranged that an output of the PLL circuit is used as a reference clock signal for a circuit, for example. Due to various factors, the output signal of the PLL circuit includes noises and jitter. Significant noises and jitter components in this clock signal may be a cause of degrading a quality of a digital audio device etc., for example. Therefore, to control the noises and jitter in the output signal of the PLL circuit has been a problem, and a variety of approaches are proposed.

Further, although VCO (Voltage Controlled Oscillator: voltage control oscillating circuit) is used as an oscillator which outputs a signal in a PLL circuit, an arrangement of an A/D convertor+CPU+DDS (Direct Digital Synthesizer) may be used instead of the above-mentioned VCO for the purpose of high-speed control of an oscillation frequency.

FIG. 1 is a block diagram showing the arrangement, in which reference numeral 1 indicates an oscillating circuit, reference numeral 2 shows a buffer circuit, reference numeral 3 denotes a frequency divider for frequency dividing an oscillation output from the above-mentioned oscillating circuit 1, reference numeral 4 indicates a phase comparator for comparing a phase difference between a frequency divided output from the above-mentioned frequency divider 3 and a feedback signal of a PLL loop, and reference numeral 5 shows a loop filter for integrating an output of the above-mentioned phase comparator 4.

Further, reference numeral 6 indicates an A/D converter for converting an output of the above-mentioned loop filter 5 into a digital value, and reference numeral 7 denotes CPU for supplying frequency data to DDS based on the digital data from the above-mentioned A/D converter 6. Reference numeral 8 shows DDS which performs accumulation and addition operation of the frequency data from the above-mentioned CPU based on a clock signal from a reference oscillator 9, carries out D/A conversion therefor, and outputs an analog signal. Reference numeral 10 indicates a frequency divider which frequency divides the analog signal from the above-mentioned DDS 8 and supplies it to the phase comparator 4.

In other words, since the above-mentioned CPU 7 and DDS 8 are included in the PLL loop, the oscillation frequency of DDS 8 is controlled at a high speed so as to reduce the phase difference between the above-mentioned oscillating circuit 1 and a DDS output, thereby constituting a digital phase lock loop which follows the oscillation frequency of the oscillating circuit 1.

As shown in FIG. 1, the arrangement in which DDS is included in the PLL circuit is disclosed in Patent Document 1 below.

Patent Document 1: Japanese Patent Application Publication No. H8-340254

Incidentally, a crystal oscillator is used for the oscillating circuit 1 in the above-mentioned PLL circuit as an oscillation source. This crystal oscillator has a structure in which metal thin films as electrodes are attached to both sides of a strip cut out of a quartz crystal to be in the shape of a thin plate. It acts to vibrate at a constant resonance frequency when an alternate electric field is applied to the electrodes. If a substance adheres onto the electrode of this crystal oscillator, then the resonance frequency decreases in proportion to a mass of the substance, which can be used as a microbalance. This method is referred to as a QCM (Quarts Crystal Microbalance: crystal oscillator microbalance) method.

Then, in technical fields, such as deposition and sputtering, the above-mentioned QCM method is used as a film-thickness meter where the resonance frequency of the crystal oscillator is monitored so that a thickness of a film formed by deposition, sputtering, etc. and a film forming speed are measured. Further, the PLL circuit as shown in FIG. 1 is used as a means for monitoring the resonance frequency of the crystal oscillator.

FIG. 2 shows a block diagram of the film-thickness measuring device, and its basic arrangement is similar to that of the PLL circuit shown in FIG. 1. Therefore, in the film-thickness measuring device shown in FIG. 2, the same reference numeral is used to indicate a block which achieves the same function as that of the arrangement shown in FIG. 1.

In addition, as for the above-mentioned film-thickness measuring device using the QCM method, an oscillating circuit section A is constituted by the oscillating circuit 1 and the buffer circuit 2 as shown in FIG. 2, and the circuit arrangement which is indicated by reference numerals 3 to 10 and phase locked to an output of the buffer circuit 2 constitutes a frequency measurement section B. Further, the crystal oscillator 11 connected to the above-mentioned oscillating circuit 1 is accommodated in a vacuum chamber C where deposition or sputtering is carried out. By means of such an arrangement, the oscillation frequency of the oscillating circuit 1 is measured, and the film thickness and the film forming speed are calculated based on the measured value.

The arrangement in which the crystal oscillator is used as a piezoelectric crystal and the film thickness of the film forming material deposited on the electrode film of the piezoelectric crystal is measured by the QCM method as described above is disclosed in Patent Document 2 below.

Patent Document 2: Japanese Patent Application Publication No. H11-160057

DISCLOSURE OF THE INVENTION

Problems to be Solved by the Invention

Incidentally, as for the resonance frequency of the crystal oscillator in the film-thickness measuring device by way of the above-mentioned QCM method, not only a fundamental wave but also odd multiples (such as third and fifth) of overtone oscillations are known well. However, there are actually many subresonances (spurious) in close proximity with the fundamental oscillation.

FIG. 3 is a graph showing a frequency characteristic of an AT-cut crystal oscillator with a fundamental oscillation frequency of 6 MHz i.e., the frequency characteristic which shows a fundamental oscillation and spurious oscillations of the crystal. In addition, an ordinate axis in FIG. 3 represents impedance [Impedance (ohm)], and an abscissa axis represents frequency [Frequency (MHz)]. As shown in FIG. 3, where the frequency is about 200 kHz higher than that of the fundamental oscillation (indicated by "fundamental") there is a first spurious oscillation (indicated by "spurious 1"), henceforth followed by a second spurious, a third spurious (indicated by "spurious 2" and "spurious 3").

Further, in the case where the QCM method is used for the above-mentioned film-thickness measuring device, even if the metal film formed as a film on the electrode of the crystal oscillator is attached to have a comparatively thick film, it can maintain the fundamental oscillation. However, in the case of an organic film, a thin film may cause the oscillation to be unstable, or the fundamental oscillation may not be maintained but may transit to a spurious oscillation mode. If this is the case, it is impossible to measure the film thickness and the film forming speed correctly, thus leading to a problem that the crystal must be replaced frequently.

FIG. 4 is an example which shows frequency changes and the film forming speeds when the 6-MHz AT-cut crystal oscillator is mounted as the crystal oscillator 11 and quinolinol aluminum complex ($Alq^3$) is deposited in the film-thickness measuring device shown in FIG. 2. In addition, a usual Colpitts oscillating circuit is used for the oscillating circuit 1 in this film-thickness measuring device.

In FIG. 4, a left ordinate axis represents the film forming speed [Deposition Rate] (nm/s) and a right ordinate axis represents the frequency [Frequency] (MHz). Further, the abscissa axis represents lapsed time [Time] (min).

As shown in FIG. 4, when the film deposited on the crystal oscillator becomes thick, lots of noises and jitters take place in an oscillation wave, and there are many parts where the rate of deposition on the crystal oscillator cannot be measured correctly (indicated as "unstable deposition rate" in FIG. 4). Further, FIG. 4 shows the transition to the spurious oscillation mode where the frequency has shifted from 5.9 MHz to 5.8 MHz by about 200 kHz (indicated as "spurious oscillation" in FIG. 4).

In addition, there are five periods in which the deposition rate is O (zero) in FIG. 4 and the frequency does not change. The deposition is not carried out during the periods. Since the measurement is carried out for several days, there are some periods when the deposition equipment is stopped. For such a reason, the graph shown in FIG. 4 includes the periods when the deposition is stopped.

As described above, after transiting to the spurious oscillation mode, the vacuum chamber has to be frequently exposed to atmosphere in order to replace the crystal oscillator, leading to another problem that manufacturing efficiency is not increased.

The present invention arises in view of the above-mentioned problem, and aims at providing a PLL circuit which can considerably reduce noises and jitter components contained in an oscillation wave, and providing a film-thickness measuring device which can measure a film thickness and a film forming speed correctly using the above-mentioned PLL circuit.

Means to Solve the Problems

The film-thickness measuring device in accordance with the present invention made in order to solve the above-mentioned problems is a film-thickness measuring device having an oscillating circuit, including a piezoelectric element, and a frequency measurement circuit for measuring a frequency of an output signal of the above-mentioned oscillating circuit, in which a film forming material is deposited on the above-mentioned piezoelectric element, and a film thickness of the above-mentioned film forming material is measured based on a change of a natural frequency of the above-mentioned piezoelectric crystal by deposition of the above-mentioned film forming material, wherein the above-mentioned frequency measurement circuit comprises a phase comparator into which the above-mentioned output signal of the above-mentioned oscillating circuit is inputted as a reference signal, a loop filter into which the output signal of the above-mentioned phase comparator is inputted, an A/D converter for converting the output signal of the above-mentioned loop filter into a digital signal, a calculation circuit into which the digital signal outputted from the above-mentioned A/D convertor is inputted, and a DDS (direct digital synthesizer) for outputting a signal with a frequency according to a frequency setting signal outputted from the above-mentioned calculation circuit, the output signal of the above-mentioned DDS is arranged to be inputted into the above-mentioned phase comparator as a comparison signal which is compared with the above-mentioned reference signal, and a part of the output signal of the above-mentioned DDS is arranged to be injected into the above-mentioned oscillating circuit as an injection synchronization signal.

DESCRIPTION OF REFERENCE SIGNS

Figure 1:
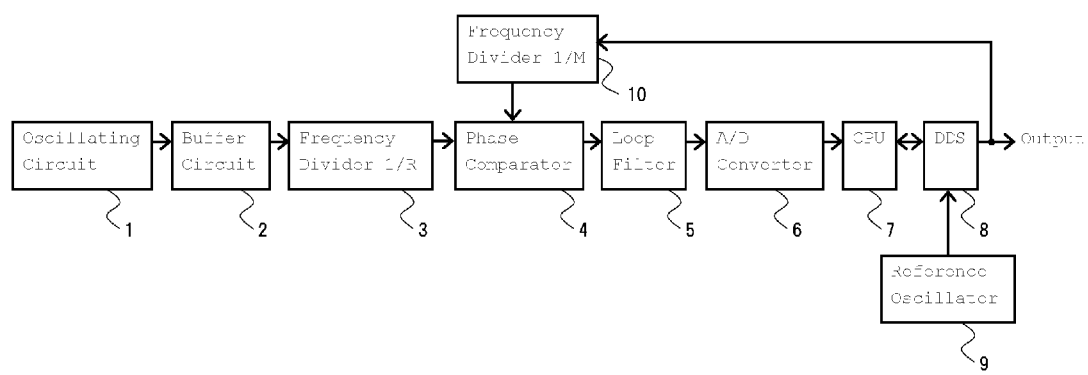
FIG. 1 is a block diagram of a PLL circuit using a conventional DDS.
Figure 2:
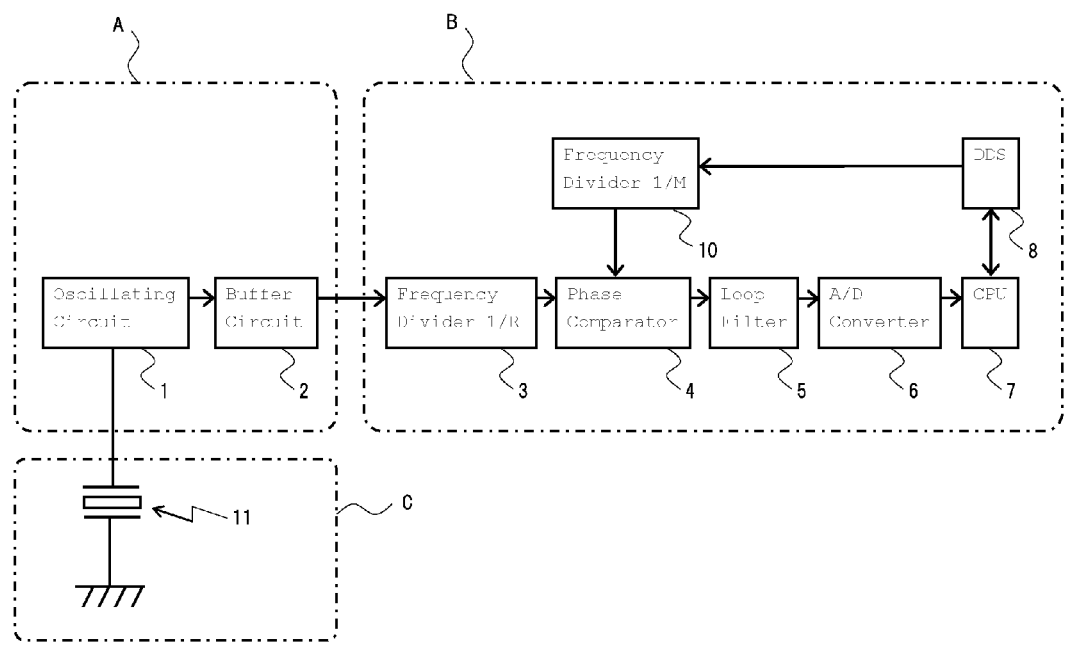
FIG. 2 is a block diagram showing an example of a conventional film-thickness measuring device using the PLL circuit shown in FIG. 1.

1: oscillating circuit (first oscillating circuit)
2: buffer circuit
3: frequency divider
4: loop filter
5: phase comparator
6: A/D converter
7: CPU 8: DDS (second oscillating circuit)
9: reference oscillator
10: frequency divider
11: piezoelectric element (crystal oscillator)
14: filter circuit
15: frequency divider
A: oscillating circuit section
B: frequency measurement section
C: vacuum chamber
L1: inductor
R1: dumping resistor

BEST MODE FOR CARRYING OUT THE
INVENTION

Figure 5:
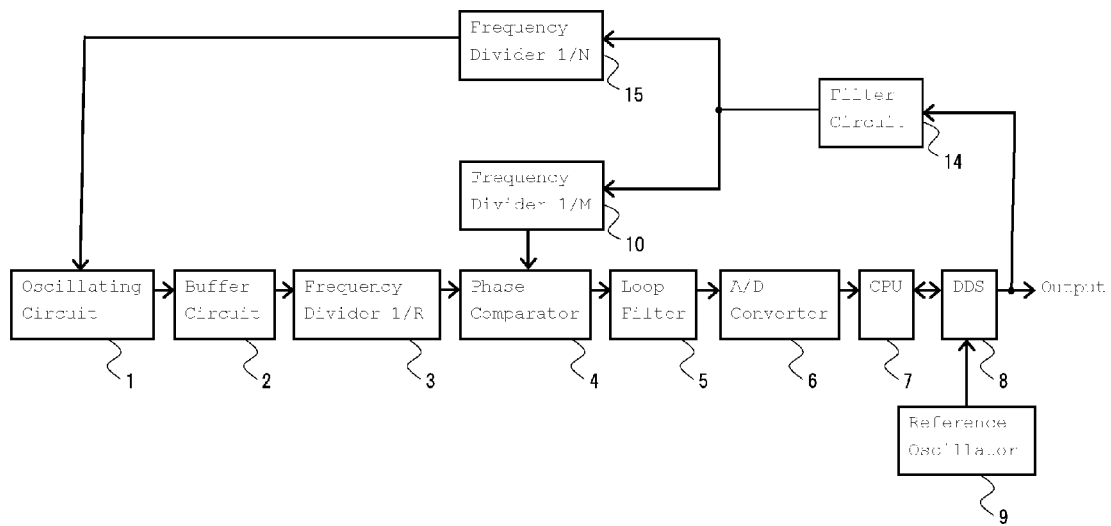
FIG. 5 is a block diagram of a PLL circuit using a DDS in accordance with the present invention.

Hereinafter, a film-thickness measuring device in accordance with the present invention using a PLL circuit will be described with reference to the preferred embodiments shown in the drawings. Now, FIG. 5 is a block diagram showing a basic arrangement of the PLL circuit used by the film-thickness measuring device in accordance with the present invention. In addition, in the PLL circuit shown in FIG. 5, the same reference sign is used to indicate a block which achieves the same function as that of the arrangement shown in FIG. 1. Therefore, the detailed description will not be repeated.

In the PLL circuit as shown in FIG. 5, it is characterized in that apart of an output signal of DDS 8 (which is also referred to as a second oscillating circuit) is arranged to be injected as an injection synchronization signal into an oscillating circuit 1 (which is also referred to as a first oscillating circuit). In other words, as shown in FIG. 5, the output signal of DDS 8 as the second oscillating circuit is supplied to a frequency divider 15 through a filter circuit 14 for removing a higher-harmonic component and obtaining a sine wave, and the frequency-divided output by this frequency divider 15 is arranged to be injected into the first oscillating circuit 1 as the injection synchronization signal.

According to this structure, the frequency-divided output through a frequency divider 10 is fed back to a phase comparator 4 which constitutes the PLL circuit including DDS 8 and the frequency-divided output through the frequency divider 15 is adapted to be injected into the first oscillating circuit 1 as the injection synchronization signal, so that the PLL circuit which allows fewer noises and jitters and considerably improves the stability of frequency can be provided as will be described later.

Figure 6:
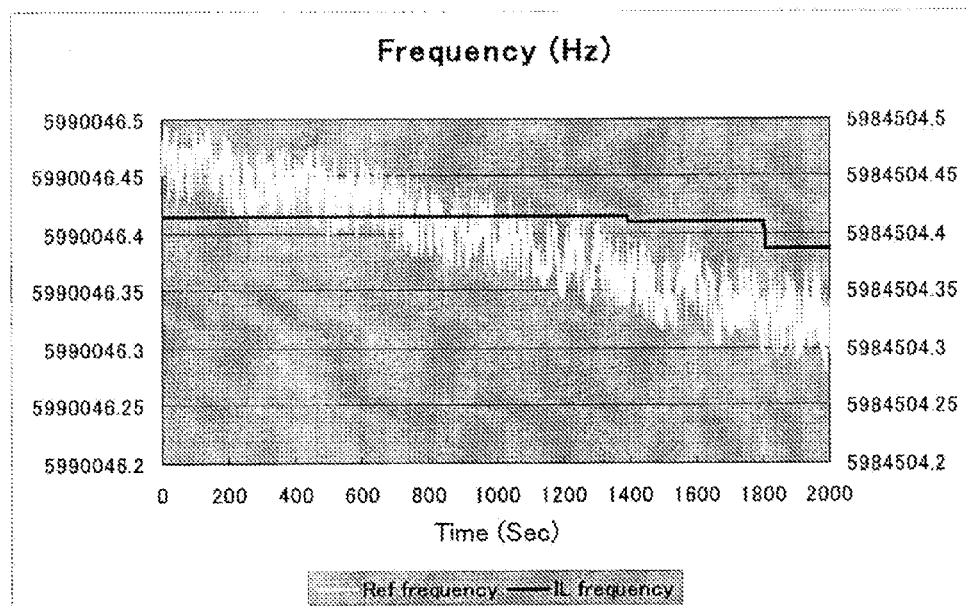
FIG. 6 is a graph in which frequency stabilities are compared between that of the PLL circuit shown in FIG. 5 and that of the conventional PLL circuit shown in FIG. 1.

FIG. 6 shows measurement results in which frequency stabilities are compared between that of the PLL circuit shown in FIG. 5 and that of the conventional PLL circuit shown in FIG. 1. In addition, an ordinate axis in FIG. 6 indicates frequency [Frequency (Hz)], and an abscissa axis indicates lapsed time [Time (Sec)]. Further, a solid line (as IL frequency) indicates that of the PLL circuit shown in FIG. 5 and an outline (as Ref frequency) indicates that of the conventional PLL circuit as shown in FIG. 1.

A Colpitts oscillating circuit by means of a 6-MHz AT cut crystal oscillator is used as the oscillating circuit 1 in FIGS. 1 and 5. As for the frequency divider 3, one that allows a frequency division ratio of 1:2 is used. As for the frequency divider 10, one that allows a frequency division ratio of 1:8 is used. Further, as for the frequency divider 15 in the PLL circuit shown in FIG. 5, one that allows a frequency division ratio of 1:4 is used.

Figure 7:
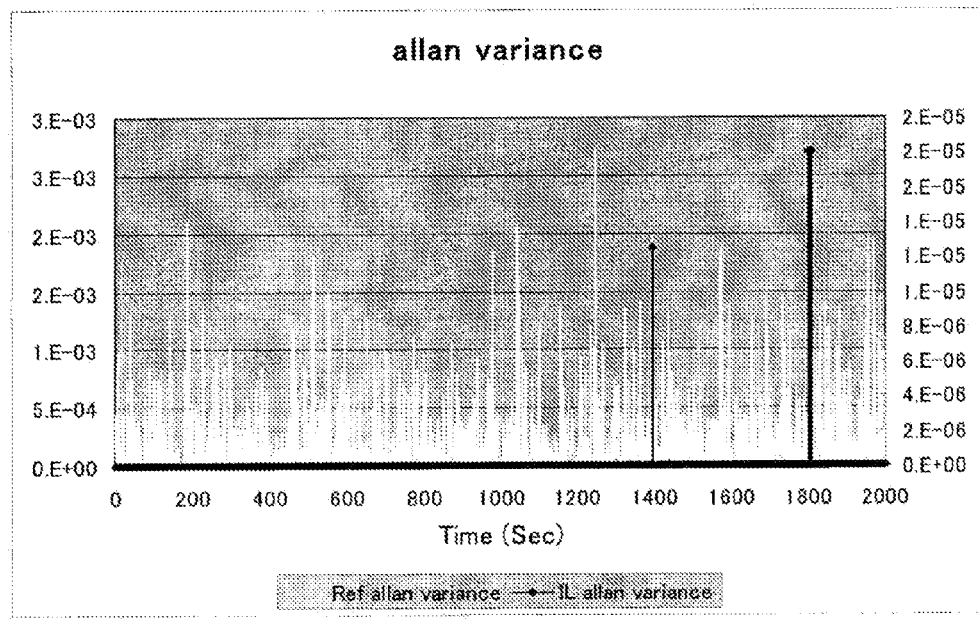
FIG. 7 is a graph showing time variations of the Allan variance by means of the PLL circuit shown in FIG. 5 and by means of the conventional PLL circuit shown in FIG. 1.

Furthermore, FIG. 7 shows time variations of the Allan variance by means of the PLL circuit shown in FIG. 5 and by means of the conventional PLL circuit shown in FIG. 1. Also in this FIG. 7, a solid line (as IL allan variance) indicates that of the PLL circuit shown in FIG. 5 and an outline (as Ref allan variance) indicates that of the conventional PLL circuit as shown in FIG. 1.

As shown in FIG. 7, when an Allan standard deviation which is a square root of the Allan variance is taken as an indicator with respect to the stability of the oscillating circuit, an Allan standard deviation in the output signal of the conventional PLL circuit shown in FIG. 1 is $1.0e^{-10}$. While, an Allan standard deviation in the output signal of the PLL circuit arranged such that the output signal from DDS is injected into the oscillating circuit 1 as shown in FIG. 5 results in $1.5e^{-11}$ (when averaged time $\tau=1$).

In addition, the Allan standard deviations of various oscillators are as follows. Although TCXO is used as the above-mentioned reference oscillator 9 of DDS 8, stability equivalent to that of a rubidium oscillator is obtained and it can be said that the very stable output can be obtained according to the above-mentioned PLL circuit shown in FIG. 5. Further, if a more stable oscillator is used for the reference oscillator 9 of DDS, then it is possible to raise the stability further.

Figure 8:
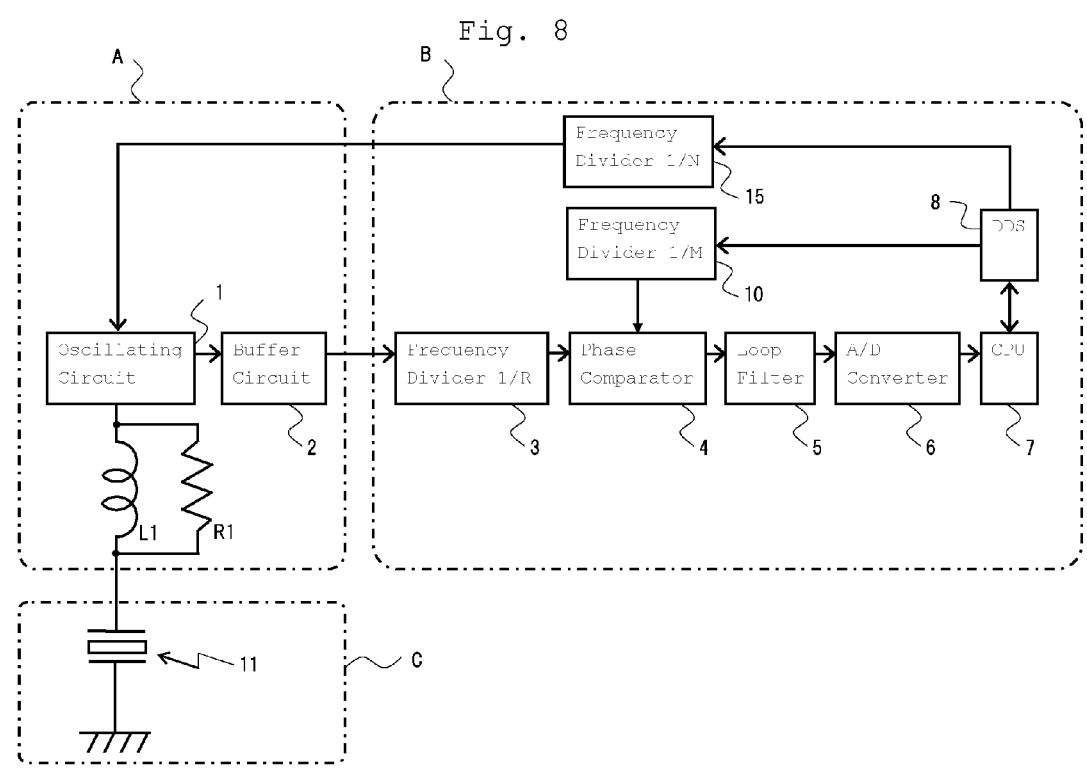
FIG. 8 is a block diagram showing an example of the film-thickness measuring device in accordance with the present invention using the PLL circuit shown in FIG. 5.

(1) TCXO (Temperature Compensated Crystal Oscillator: temperature-compensation type crystal oscillator) in which a temperature-compensation circuit is added to a crystal oscillating circuit to attain higher stabilization.
Allan standard deviation: $1.00e^{-09}$
(2) Rubidium oscillator
Allan standard deviation: $3.00e^{-11}$
(3) OCXO (Oven Controlled Crystal Oscillator: temperature-control type crystal oscillator) in which the crystal oscillating circuit is placed in a high temperature oven to attain higher stabilization.
Allan standard deviation: $4.00e^{-12}$ Next, by means of a block diagram, FIG. 8 shows the preferred embodiment of the film-thickness measuring device in accordance with the present invention using the PLL circuit shown in FIG. 5. In addition, a basic arrangement of the film-thickness measuring device shown in FIG. 8 is similar to that of the PLL circuit shown in FIG. 5. Therefore, in the film-thickness measuring device shown in FIG. 8, the same reference sign is used to indicate a block which achieves the same function as that of the arrangement shown in FIG. 5.

In addition, also in the film-thickness measuring device shown in FIG. 8, the oscillating circuit 1 and the buffer circuit 2 constitute the oscillating circuit section A. The circuit arrangement which is indicated by reference signs 3 to 15 and carries out phase lock to an output of the buffer circuit 2 constitutes the frequency measurement section B. Further, the crystal oscillator 11 connected to the above-mentioned oscillating circuit 1 is accommodated in a vacuum chamber C where deposition or sputtering is performed.

In addition, in the film-thickness measuring device shown in FIG. 8, the synchronization signal from DDS 8 is injected into the oscillating circuit 1 through the frequency divider 15, and the crystal oscillator 11 is connected to the oscillating circuit 1 through a parallel circuit of an inductor L1 and a dumping resistor R1. In addition, the above-mentioned dumping resistor R1 is provided in order to prevent the above-mentioned inductor L1 and parallel capacitance Cb (to be set forth later) of the crystal oscillator 11 from oscillating unusually.

Figure 9:
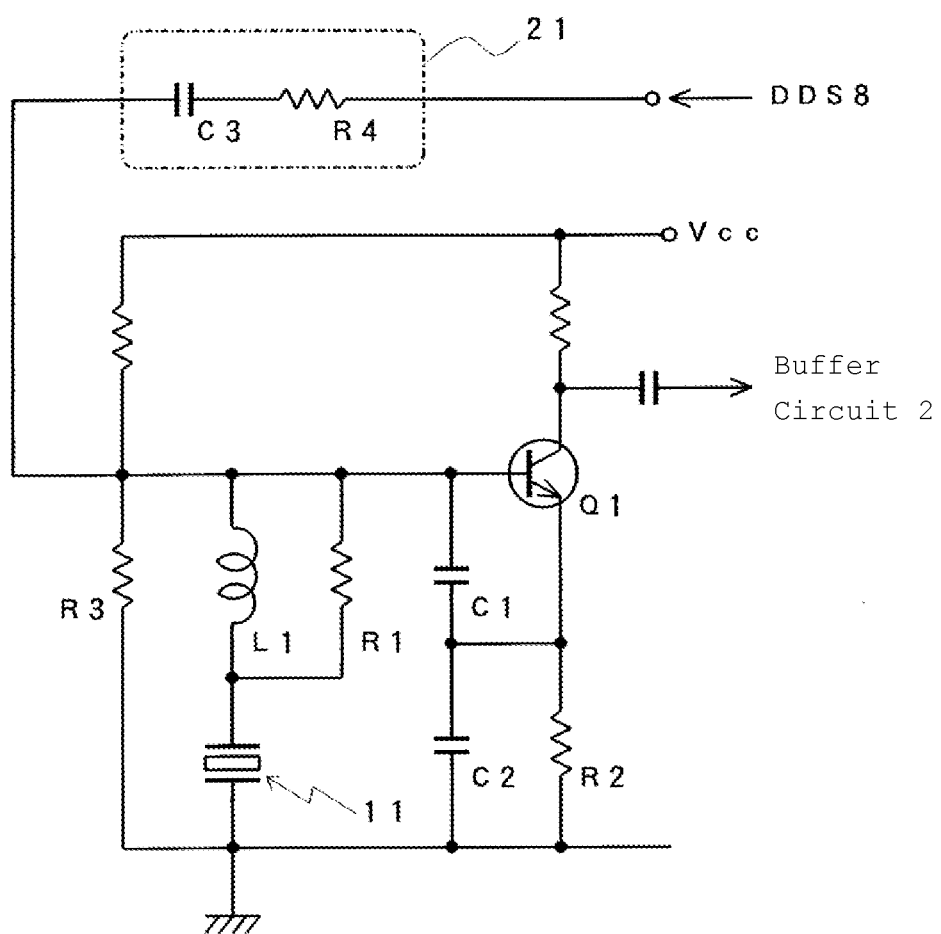
FIG. 9 is a circuit diagram showing a particular example of a circuit arrangement of the oscillating circuit shown in FIG. 8.

Further, FIG. 9 shows a particular example of a circuit arrangement of the oscillating circuit 1 shown in FIG. 8, and shows the usual Colpitts oscillating circuit. In other words, in the basic arrangement of the Colpitts oscillating circuit, a capacitor C1 is connected to a base and an emitter of a transistor Q1, a capacitor C2 and resistor R2 are connected to the emitter and the ground, a resistor R3 and a crystal oscillator 11 are connected to the base and the ground.

In addition, as described above in this preferred embodiment, the parallel circuit of the inductor L1 and the dumping resistor R1 is connected to the crystal oscillator 11 in series, which are connected to the base of the transistor Q1 and the ground. In addition to this, the synchronization signal from the above-mentioned DDS 8 is frequency divided by the frequency divider 15 then injected into the base of the above-mentioned transistor Q1 through a coupling element 21.

The above-mentioned coupling element 21 is constituted by a series circuit of a resistor R4 and a capacitor C3, but may be constituted by only the resistor R4 or only the capacitor C3. Further, this preferred embodiment is constituted by the Colpitts oscillating circuit using the transistor, but may also use other usual oscillating circuits.

In this way, in the film-thickness measuring device shown in FIG. 8, the synchronization signal from DDS 8 is injected into the oscillating circuit section A, to which the crystal oscillator 11 is connected through the inductor L1 and the dumping resistor R1. Further, it is arranged that in the frequency measurement section B the phase comparator 4 compares a phase of a signal obtained by frequency dividing the input from the oscillating circuit section A by means of the frequency divider 3 with that of a signal obtained by frequency dividing the output of DDS 8 by means of the frequency divider 10 and the resultant signal is supplied to CPU 7 through a loop filter 5 and an A/D converter 6.

The above-mentioned CPU 7 controls the oscillation frequency of DDS 8 to be at a high speed so that a phase difference between the output of the oscillating circuit section A and the output of DDS 8 may be minimized, thus constituting a digital phase lock loop which follows the oscillation frequency. Further, the output of DDS 8 is frequency divided by the frequency divider 15 and inputted as the injection synchronization signal into the oscillating circuit 1, constituting a second feedback loop.

Figure 10:
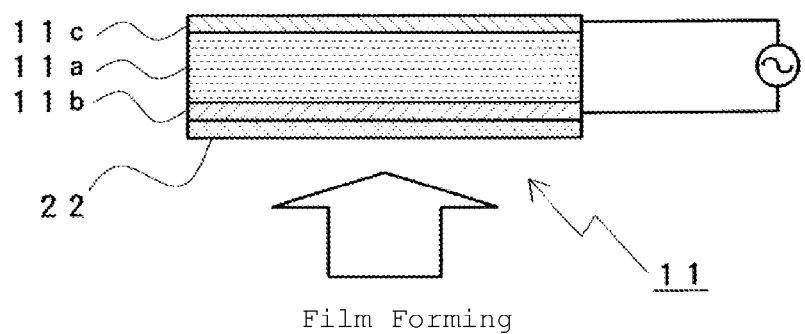
FIG. 10 is a sectional view showing an example of a crystal oscillator provided for measuring film thickness.

FIG. 10 shows an example of the crystal oscillator as a piezoelectric element provided for measuring a film thickness with the above-mentioned QCM system. As described above, this crystal oscillator 11 has a structure in which electrodes 11b and 11c formed of metal thin film are respectively attached to both sides of a strip 11a cut out of the quartz crystal to be in the shape of a thin plate. It acts to vibrate at a constant resonance frequency when an alternate electric field is applied across the above-mentioned electrodes 11b and 11c.

Figure 11:
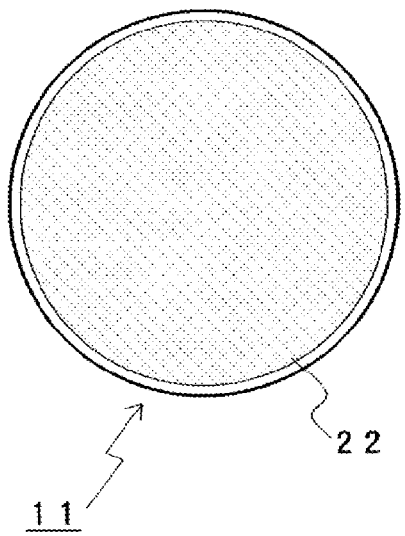
FIG. 11(A) and FIG. 11(B) are front views showing a state of each side of the crystal oscillator shown in FIG. 10.
Figure 11:
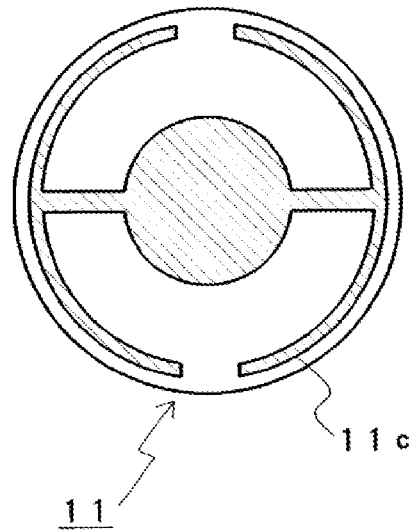

In the crystal oscillator provided for measuring the film thickness of the above-mentioned QCM system, the electrode 11b as a metal thin film on which a film forming substance 22 is deposited is formed in a circular shape similar to that of the crystal strip as shown in FIG. 11(A). Further, as shown in FIG. 11(B), the other electrode has a shape in which an island-like area is formed in the center and partly connected with ring-shaped electrodes formed in the circumferential edge.

Figure 12:
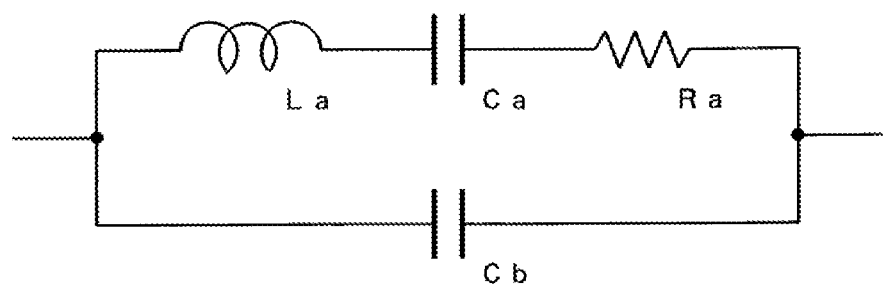
FIG. 12 is an equivalent circuit diagram of the crystal oscillator.

FIG. 12 is an equivalent circuit of the above-mentioned crystal oscillator 11 and can be expressed with an equivalent series inductance La, an equivalent series capacitance Ca, an equivalent series resistance Ra, and an parallel capacitance Cb. The equivalent series inductance La is a factor indicating density, the equivalent series capacitance Ca is a factor indicating viscosity, the equivalent series resistance Ra is a factor indicating oscillation loss, and the parallel capacitance Cb is a capacitance value as a capacitor since the crystal oscillator is arranged such that the crystal is sandwiched with the electrodes.

As described above, when the film forming substance 22 is deposited on the electrode 11b, the oscillation loss increases with a mass addition effect and a resonance property is considerably worsened. When a frequency characteristic of the crystal oscillator is measured with an impedance analyzer, each constant in this equivalent circuit can be calculated.

Figure 3:
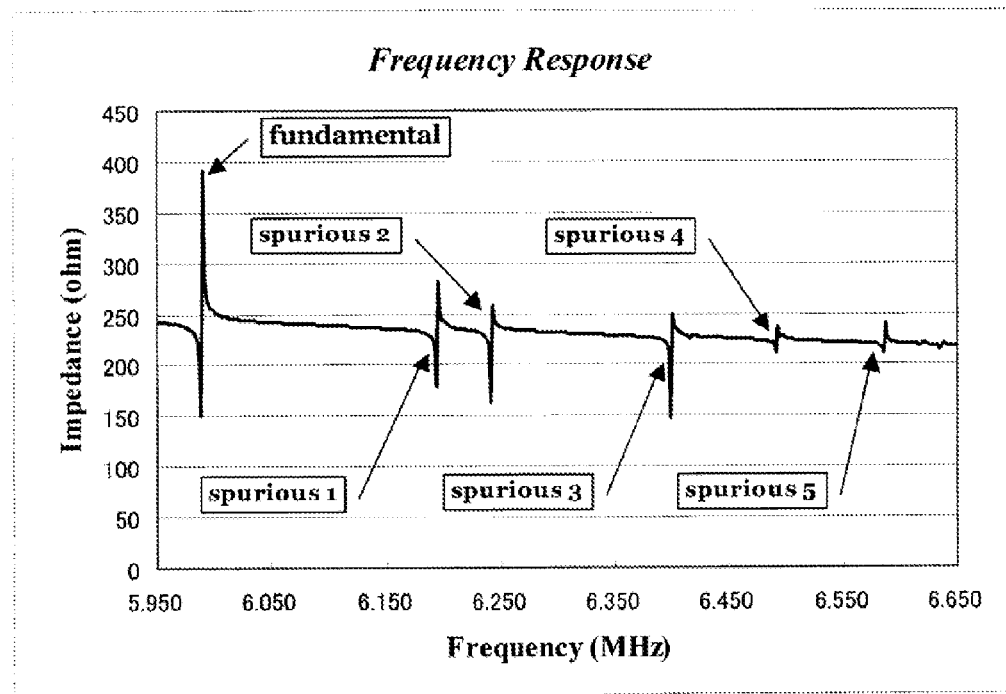
FIG. 3 is a frequency characteristic graph showing a fundamental oscillation and spurious oscillations of a crystal in the PLL circuit shown in FIG. 1.
Figure 13:
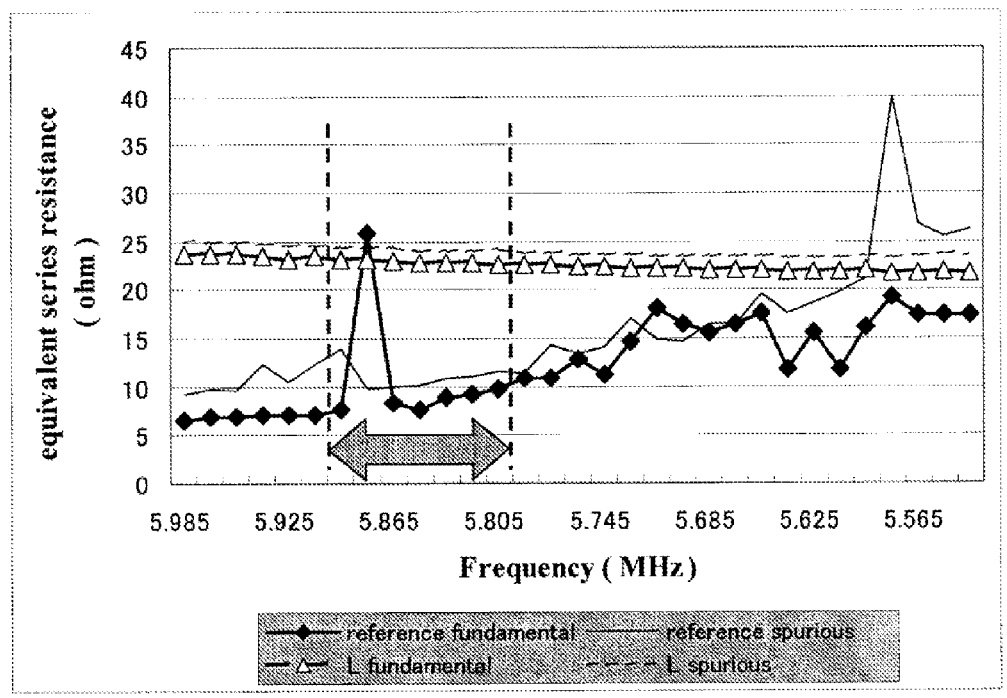
FIG. 13 is a graph showing changes of equivalent series resistance due to an effect of series inductance connected to the crystal oscillator.

FIG. 13 is a graph when the fundamental oscillation and the equivalent series resistance of a first spurious oscillation loss which are shown in FIG. 3 are respectively measured by changing the frequency. In addition, in FIG. 13, an ordinate axis shows the value [equivalent series resistance (ohm)] of equivalent series resistance, and the abscissa axis shows the frequency (Frequency (MHz)).

Figure 4:
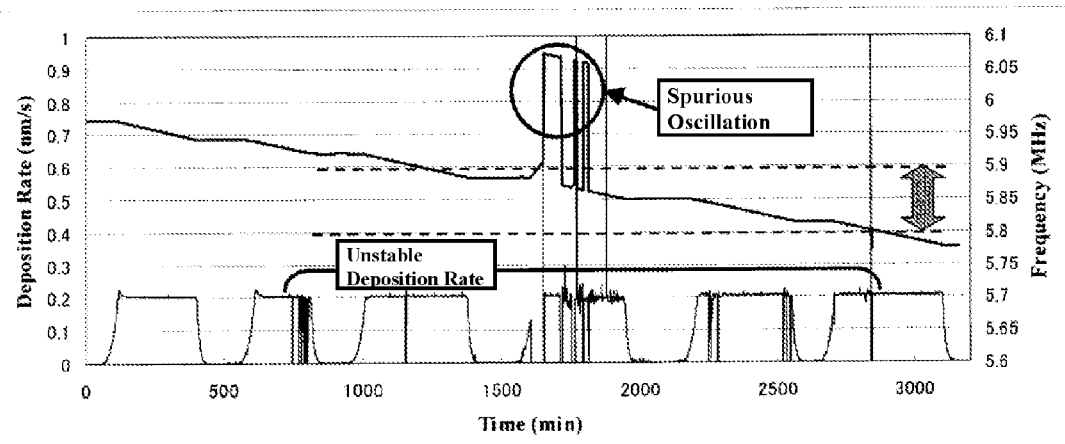
FIG. 4 is a graph showing frequency changes and film forming speeds (or deposition rates) measured by the film-thickness measuring device shown in FIG. 2.

It can be seen from this FIG. 13 that the equivalent series resistance of the fundamental oscillation considerably changes between 5.9 MHz and 5.8 MHz where transition is made to a spurious oscillation mode in FIG. 4 above and the resistance is reversed or exceeded in part by that of the spurious value, and it can be seen that when the deposition further increases to reduce the oscillation frequency, the value of the equivalent series resistance becomes unstable.

It is considered that since the change of this equivalent series resistance prevents the fundamental oscillation from being maintained and causes the transition to the spurious oscillation mode, leading to unstable oscillation frequency. Here, as shown in FIGS. 8 and 9, if the inductor L1 (for example, 4.7 µH) is connected to the crystal oscillator 11 in series and the frequency characteristic is measured, then the reverse phenomenon of the equivalent series resistance is not found between the fundamental oscillation and the spurious and it can be seen that the values are also stable.

Figure 14:
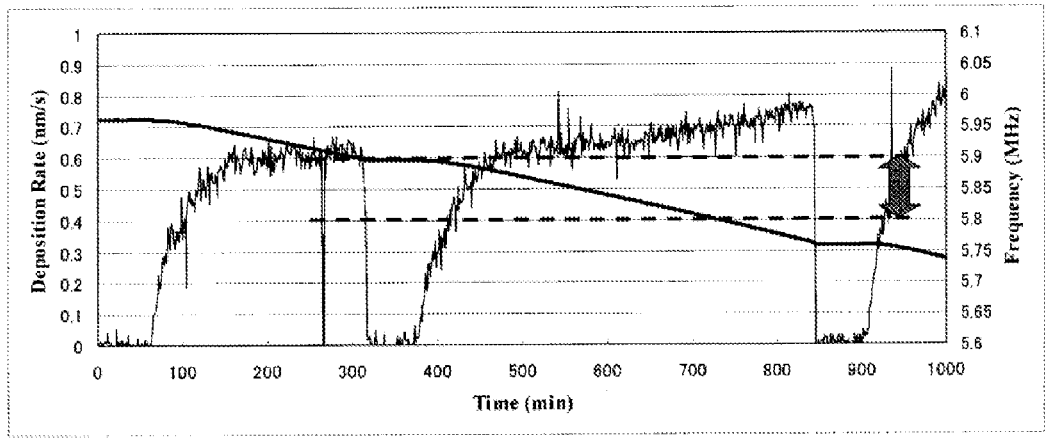
FIG. 14 is a graph showing changes of a frequency and a film forming speed due to the effect of the series inductance connected to the crystal oscillator.

FIG. 14 shows the change characteristics of the film forming speed and the frequency when the inductor L1 is connected in series to the crystal oscillator 11 in the same conditions as those in the case of FIG. 4. However, power of an evaporation source is increased to carry out the measurement so that the oscillation frequency of the crystal oscillator may reach soon the area of 5.9 to 5.8 MHz and the film forming speed may be from 0.2 nm/sec to 0.6 nm/sec. It can be seen from this graph that the fundamental oscillation is maintained, without transition to the spurious oscillation mode. However, referring to FIG. 14, the film forming speed is not stabilized yet but there are noises and jitters in the measured oscillation frequency.

The above-mentioned output of DDS 8 follows the changes of the oscillation frequency of the crystal oscillator at a high speed, and its oscillation wave has very few noises and jitters. If the output of this DDS 8 is injected into the oscillating circuit, and a draw phenomenon is induced, the oscillation of the crystal oscillator is stabilized, and the noises and jitters are considerably reduced. This injection synchronous circuit can continue the stable oscillation, following the oscillation frequency of the crystal oscillator which changes greatly, since it is a new feedback circuit for injecting the output of DDS 8 of the frequency measurement section.

Figure 15:
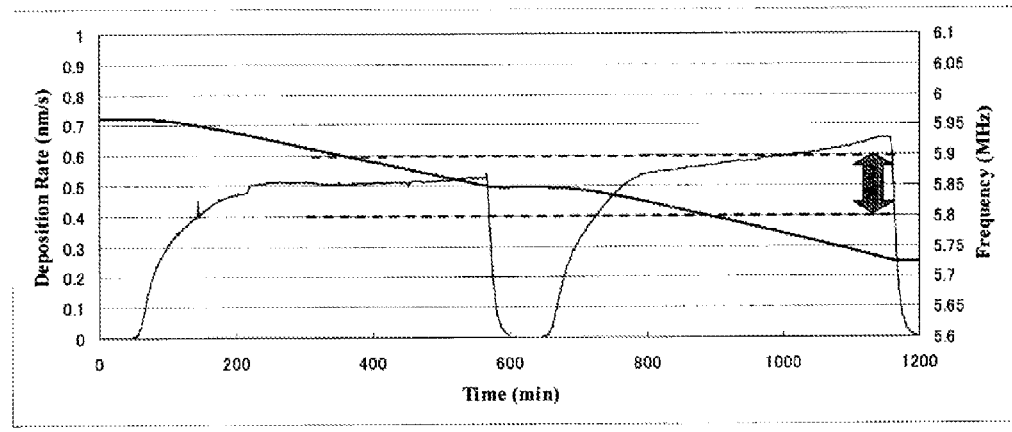
FIG. 15 is a graph showing changes of the frequency and the film forming speed due to the series inductance connected to the crystal oscillator and the effect of an injection synchronization signal.

FIG. 15 shows the change characteristics of the film forming speed and the frequency at this time. It can be seen that the film forming speed is measured in a very stable situation. In this way, by the above-mentioned injection synchronizing method, the crystal oscillator can provide the stable oscillation without noises or jitters, the frequency can be measured with sufficient accuracy, and the film thickness and the film forming speed can be measured correctly.

The invention claimed is:

1. A film-thickness measuring device having an oscillating circuit, including a piezoelectric element, and a frequency measurement circuit for measuring a frequency of an output signal of said oscillating circuit, in which a film forming material is deposited on said piezoelectric element, and a film thickness of said film forming material is measured based on a change of a natural frequency of said piezoelectric crystal by deposition of said film forming material, wherein said frequency measurement circuit comprises a phase comparator into which an output signal of said oscillating circuit is inputted as a reference signal, a loop filter into which the output signal of said phase comparator is inputted, an A/D converter for converting the output signal of said loop filter into a digital signal, a calculation circuit into which the digital signal outputted from said A/D convertor is inputted, and a DDS (direct digital synthesizer) for outputting a signal with a frequency according to a frequency setting signal outputted from said calculation circuit, the output signal of said DDS is arranged to be inputted into said phase comparator as a comparison signal which is compared with said reference signal, and a part of the output signal of said DDS is arranged to be injected into said oscillating circuit as an injection synchronization signal.

2. The film-thickness measuring device as claimed in claim 1, wherein an inductor is connected in series to said piezoelectric element in said oscillating circuit.

3. The film-thickness measuring device as claimed in claim 2, wherein a resistance element is connected to said inductor in parallel.

* * * * *